US007578048B2

(12) United States Patent
Wollach et al.

(10) Patent No.: US 7,578,048 B2
(45) Date of Patent: Aug. 25, 2009

(54) PATTERNS OF CONDUCTIVE OBJECTS ON A SUBSTRATE COATED WITH INORGANIC COMPOUNDS AND METHOD OF PRODUCING THEREOF

(75) Inventors: Gal Wollach, Haifa (IL); Yoash Carmi, Eilon (IL); Dany Eisenstadt, Kefar Veradim (IL)

(73) Assignee: Hanita Coatings R.C.A. Ltd, Kibbutz Hanita (IL)

( * ) Notice: Subject to any disclaimer, the term of this patent is extended or adjusted under 35 U.S.C. 154(b) by 76 days.

(21) Appl. No.: 11/730,424

(22) Filed: Apr. 2, 2007

(65) Prior Publication Data

US 2007/0226994 A1 Oct. 4, 2007

Related U.S. Application Data

(60) Provisional application No. 60/788,728, filed on Apr. 4, 2006.

(51) Int. Cl.
*H01R 43/00* (2006.01)
*H01Q 13/00* (2006.01)
(52) U.S. Cl. .............................. 29/600; 29/825; 29/846; 29/592.1; 29/601; 340/572.7
(58) Field of Classification Search .................. 29/825, 29/830–832, 846–847, 600, 601, 592.1, 594; 343/700 MS, 875, 809, 795; 340/572.7, 340/572.8, 10.33; 156/272.2; 427/97–98, 427/112
See application file for complete search history.

(56) References Cited

U.S. PATENT DOCUMENTS

| 4,822,451 | A | 4/1989 | Ouderkirk et al. |
| 4,879,176 | A | 11/1989 | Ouderkirk et al. |
| 4,968,390 | A | * 11/1990 | Bard et al. .................. 205/115 |
| 5,216,254 | A | * 6/1993 | Ohta et al. ............... 250/492.2 |
| 5,286,550 | A | 2/1994 | Yu et al. |
| 5,389,195 | A | 2/1995 | Ouderkirk et al. |
| 6,100,804 | A | 8/2000 | Brady et al. |
| 6,259,369 | B1 | 7/2001 | Monico |

(Continued)

FOREIGN PATENT DOCUMENTS

JP 63282280 A 11/1988

(Continued)

OTHER PUBLICATIONS

McClure et al., "A low-Cost Flexible Circuit on a Polyester Substrate", 1999 Society of Vacuum Coaters 505/856-7188, pp. 445-447, , 42$^{nd}$ Annual Technical Conference Proceedings (1999), ISSN: 0737-5921.

(Continued)

*Primary Examiner*—Minh Trinh
(74) *Attorney, Agent, or Firm*—Pearl Cohen Zedek Latzer, LLP

(57) ABSTRACT

According to embodiments of the present invention, a method for manufacturing a pattern of conductive elements on a substrate is provided. The method includes depositing in a vacuum deposition chamber an electrically conductive material onto the substrate to form a base layer. Then, the method includes selectively applying an electric insulating agent on selective areas of the base layer. Then, areas of the base layer that are not covered with the insulating material are electroplated with a second electrically conductive layer. The electric insulating agent is then removed from the substrate and the base layer is chemically etched thus removing the base layer that was covered with the insulating material and selectively exposing the substrate to create the pattern of conductive objects on the substrate.

14 Claims, 8 Drawing Sheets

U.S. PATENT DOCUMENTS

| | | |
|---|---|---|
| 7,260,882 B2 * | 8/2007 | Credelle et al. ............... 29/600 |
| 2006/0187056 A1 | 8/2006 | Carmi et al. |
| 2007/0226994 A1 * | 10/2007 | Wollach et al. ............... 29/825 |

FOREIGN PATENT DOCUMENTS

| | | |
|---|---|---|
| KR | 2002 065756 | 8/2002 |

OTHER PUBLICATIONS

McClure et al., "Adhesion Promotion Technique for Coatings on PET, PEN and PI", 2000 Society of Vacuum Coaters 505/856-7188, pp. 342-346, , $43^{rd}$ Annual Technical Conference Proceedings (Apr. 15-20, 2000), ISSN: 0737-5921.

Database WPI Week 200314, Derwent Publications Ltd., London, GB; AN: 2003-145024; XP-002480824.

European Search Report Application No. EP 07 25 1477 Date of completion of the search May 20, 2008.

* cited by examiner

PATTERNS OF CONDUCTIVE OBJECTS ON A SUBSTRATE COATED WITH INORGANIC COMPOUNDS AND METHOD OF PRODUCING THEREOF

CROSS REFERENCE TO RELATED APPLICATIONS

The present application claims benefit of U.S. Provisional Patent application Ser. No. 60/788,728, filed Apr. 4, 2006, which is incorporated inhere by reference in its entirety.

BACKGROUND OF THE INVENTION

Many industrial applications involve laying down patterns of conductive material on a substrate to produce devices and flexible electronic circuits like, for example, Radio Frequency identification (RFID) antennas for RFID labels, bus bars for displays and transparent conductive electrodes (TCEs). A transparent conductive electrode, which may include a patterned grid of conductive material, enables transmission of visible light trough the grid. The layerage light transmission ratio may vary between 0.2% and 99.9% and for most cases enables substantial visibility through the grid. A conventional method of producing, for example, antennas for RFID labels is to chemically etch copper or aluminum foils laminated to polyester (PET) films. As the thickness of a standard copper film is between 18 microns and 35 microns and the thickness required for a typical antenna or a typical electrode is 11-15 microns, the etching process becomes very expensive and slow in addition to being not environmentally safe.

Another conventional method of producing RFID antennas or TCE's involves printing the required patterns with conductive ink based on pastes containing a high concentration of electrically conductive particles (mainly silver). The printing process is expensive and not suitable for fine patterns. The low electrical conductivity of standard inks is another drawback of this process. TCE's may be also produced by lamination metallic mesh to a substrate in a rather expensive and complicated process.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features and advantages thereof, may best be understood by reference to the following detailed description when read with the accompanied drawings in which:

Figure 1:
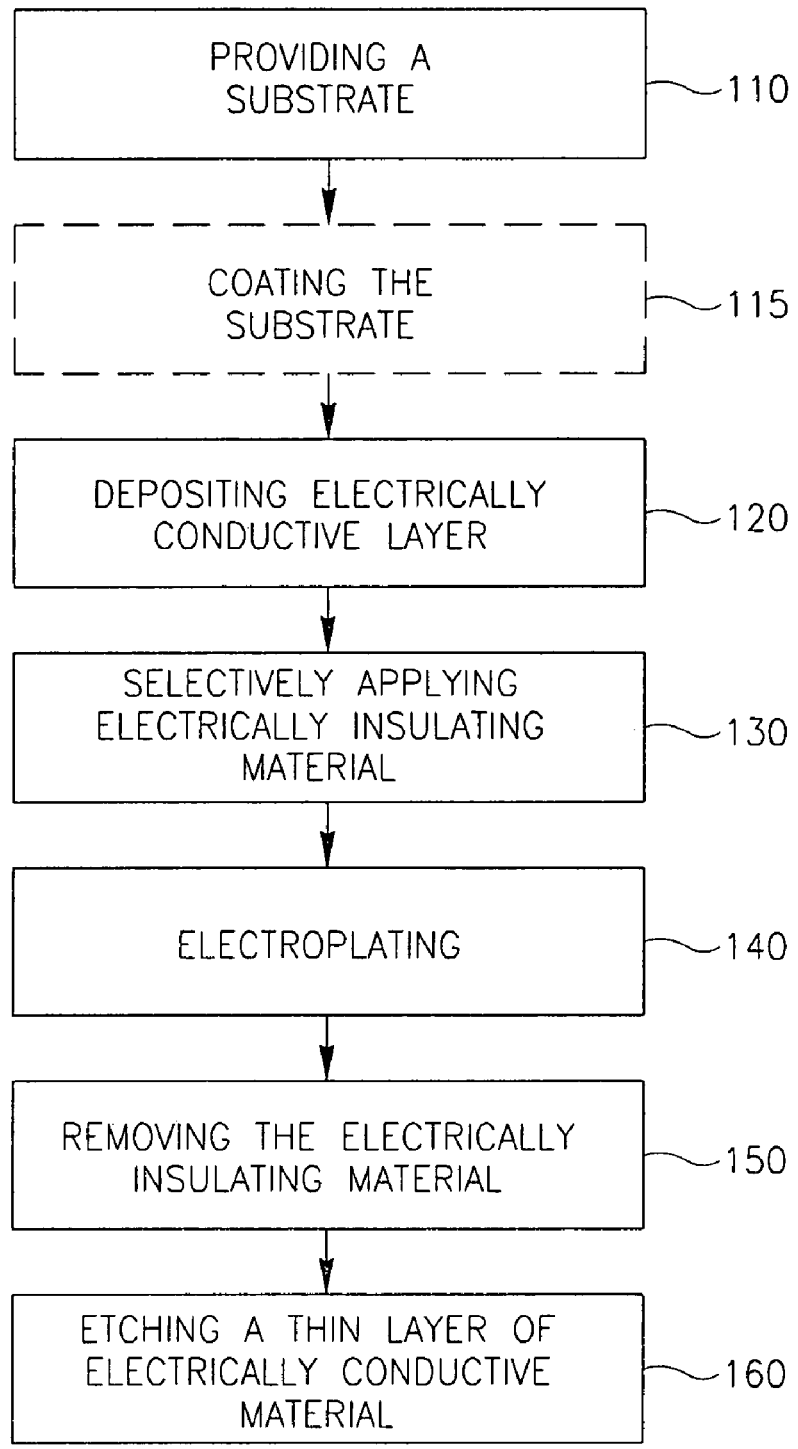
FIG. 1 is a flowchart illustration of a method for manufacturing a pattern of conductive objects according to some embodiments of the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However it will be understood by those of ordinary skill in the art that the embodiments of present invention may be practiced without these specific details. In other instances, well-known methods, procedures and components have not been described in detail so as not to obscure the present invention.

Embodiments of the present invention are directed to a method of producing a pattern of electrically conductive objects on a substrate. According to some embodiments of the present invention, the conductive objects may be flexible circuits. According to some embodiments of the present invention, the conductive objects may be antennas for Radio Frequency identification (RFID) labels. According to other embodiments of the present invention, the conductive objects may be metallic grids useful for example as transparent conductive electrodes (TCEs).

According to some embodiments of the invention, the method may include depositing onto a substrate, in a vacuum chamber, an electrically conductive layer such as, for example copper. The thickness of the layer may be less than a micron. Next, according to embodiments of the invention, the method may include applying an electric insulating material (plate resist) onto selective areas of the electrically conductive layer. The areas that are covered with the electric insulating material may be substantially complementary to areas on which RFID antennas are to be placed. According to other embodiments of the invention, the areas covered with the electric insulating material are substantially complementary to areas on which a grid structure is to be placed.

The coated substrate may then be immersed in an electrolyte solution for electroplating the electrically conductive layer, to form a layer having a desired thickness. According to some embodiments of the present invention, the thickness of the layer after electroplating may be between 0.3 micron and 40 microns. According to other embodiments of the present invention the thickness may be between 1 micron and 7 microns. However, embodiments of the invention are not limited to these ranges of values for the thickness of the electroplated layer. Next, the plate resist may be removed from the substrate using any suitable process as known in the art. Finally, a thin layer of the electrically conductive layer may be chemically etched from the entire surface such that the substrate may be revealed in the areas that were previously covered with the electrically insulating material (plate resist).

Although, in the description below, exemplary embodiments of methods of producing an array of RFID antennas or TCE grids are given, it should be understood to a person skilled in the art, that embodiments of the present invention may be used in a variety of other applications, such as, for example manufacturing of electromagnetic interference shields, transparent heaters, membranes, switches, flexible printed circuit boards, conductive panels and the like.

Figure 2A:
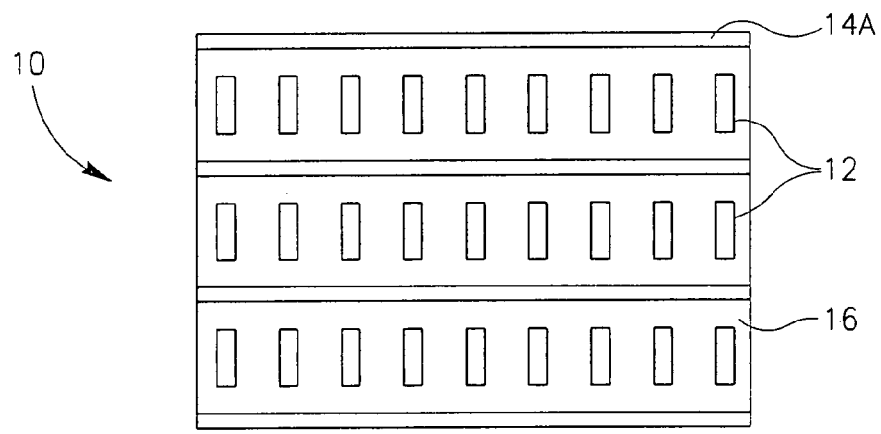
FIGS. 2A-2C are pictorial illustrations showing the manufacturing process of an exemplary array of RFID antennas according to embodiments of the present invention.
Figure 2B:
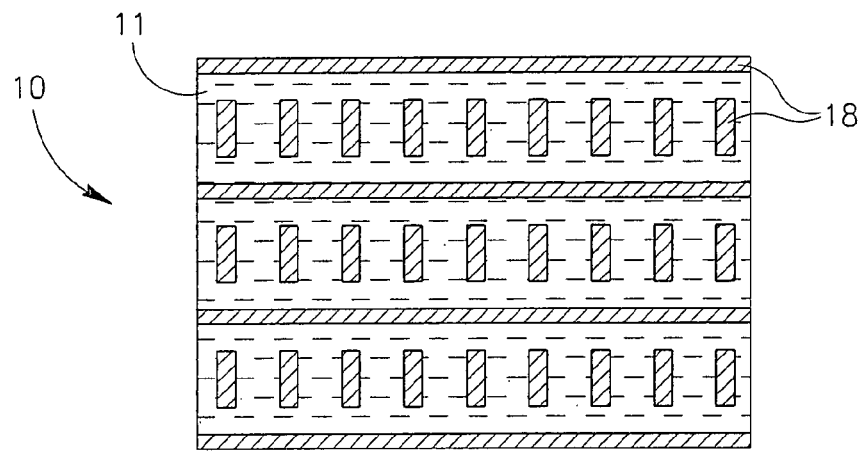
Figure 2C:
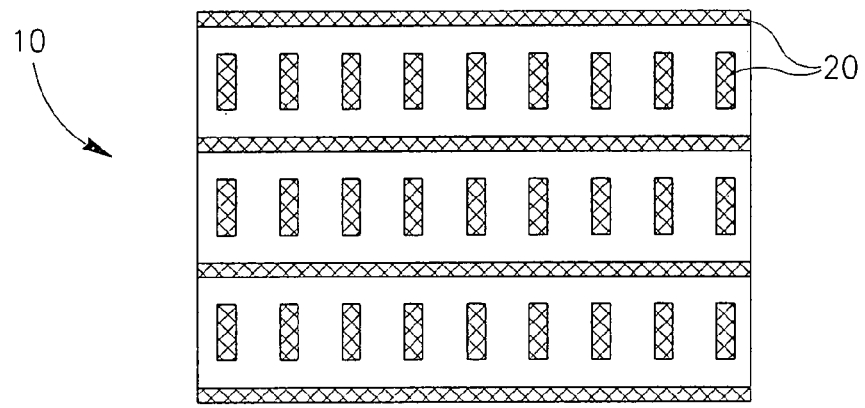

Reference is now made to FIG. 1, which is a flowchart diagram demonstrating a method for manufacturing a pattern of conductive objects, such as, for example, an array of RFID antennas or a TCE grid according to embodiments of the present invention. Reference is additionally made to FIGS. 2A-2C, which are pictorial illustrations showing the manufacturing process of an exemplary array of RFID antennas on a substrate according to embodiments of the present invention.

Firstly, the method may include providing a substrate 10 suitable for RFID labels (box 110 of FIG. 1). Substrate 10 may be continuously wound in a form of a roll. Alternatively, sheets of substrate material may be used in the manufacturing process. The substrate may be a polymeric substrate such as, for example, a polyester (PET) film, a polypropylene (PP) film, a polyethylene (PE) film, PEI film, polyimide (PI) film, polyethylenenaphtalate (PEN) film, polycarbonate (PC) substrate and PVC substrate. Alternatively, the substrate may be from other materials such as, for example treated cardboard or treated paper.

Then, the method may include depositing an electrically conductive layer onto substrate 10 (box 120 of FIG. 1). As stated above, the array of RFID antennas may be assembled using a roll-to-roll process. In these embodiments, a roll of substrate material 10 may be unwound using a substrate-feed roller for depositing an electrically conductive layer onto the substrate. According to other embodiments of the present invention, the substrate-feed roller may be replaced by a sheet feeder mechanism and substrate 10 may be then in a form of substrate sheets.

According to some embodiments of the present invention, the method may include performing an in-vacuum metallization process by resistive vapor vacuum metallization. Alternatively, according to other embodiments of the present invention, the in-vacuum metallization process may be performed by inductive vacuum metallization, sputtering, electron beam gun or any other applicable physical vacuum deposition technique as known in the art.

The vapor vacuum metallization process may include transporting substrate 10 through a cloud of metallic vapor produced by continuous introduction of metallic wires to the surface of heated evaporation boats. When the hot metallic vapor meets the surface of substrate 10, a thin metal layer is deposited onto substrate 10. The metallic substance used for this process may be copper, aluminum, nickel, silver, stainless steel and others, various metallic alloys, for example, bronze and brass or any combination of co-deposited metals.

According to other embodiments of the present invention, the method may include using wires of other electrically conductive materials. Non-limiting examples of some non-metallic conductive materials are indium-oxide and indium tin oxide (ITO). Although, for clarity and simplification, the terms a "metal layer" and "metal deposition" are used, it should be understood to a person skilled in the art that embodiments of the present invention are likewise applicable to depositions of non-metallic conductive materials. Accordingly, it should be noted that throughout the specification, whenever the terms "a metal layer" or "metal deposition" are mentioned, equivalent description may apply to "an electrically conductive layer" or "electrically conductive material deposition".

The thickness of the deposition layer is typically 0.1 micron, although it may vary between 1 nanometer and 2 microns. For example, the final desired thickness in order to achieve an acceptable performance of RFID antennas for UHF applications may be approximately 2-15 microns. The desired thickness for other applications may vary between 0.2 micron and 40 micron. Accordingly, the substrate should be further processed to achieve the desired thickness.

Optionally, according to embodiments of the present invention, prior to depositing the electrically conductive layer, the method may include depositing a thin tie-layer onto the substrate to enhance the adhesion of the base layer to the substrate (box 115 of FIG. 1). This process may be performed by sputtering, for instance. Non-limiting examples of materials suitable to act as the tie-layer may be Nickel-Chromium, Chromium, Titanium and Inconel.

Next, the method may include selectively depositing an electrically insulating material onto the electrically conductive layer (box 130 of FIG. 1) according to a pre-determined pattern. Accordingly, as illustrated at FIG. 2B, the top surface of substrate 10 after this stage may include two defined areas, namely, areas 11 having the electrically insulating surfaces referred to as "complementary areas" and areas 18 having the electrically conductive surface. Optionally, this process may be held in the vacuum chamber following in-line the previous vacuum deposition operation. Referring back to FIG. 2A, throughout the specification and the claims the terms "antenna-area" or "object areas", "complementary areas" and "auxiliary areas" relating to different areas on a surface of substrate 10 are defined as follows.

The term "antenna-areas" refers to areas on the surface of substrate 10 on which RFID antennas are placed on the substrate in the manufacturing process. With reference to FIG. 2A, areas designated by numeral 12 are the antenna-areas. Similarly, the term "object-areas" refers to areas on the surface of substrate 10 on which electrically conductive objects are placed in the manufacturing process. It should be noted that throughout the specification, whenever the antenna-areas or RFID antennas are mentioned, equivalent description may apply to object-areas and conductive objects.

The term "auxiliary areas" refers to areas on the surface of substrate 10 on which metal stripes or lines are deposited during the manufacturing process to provide efficient current connectivity. It should be understood to a person skilled in the art that instead of metal, other electrical conductive materials may be used. With reference to FIG. 2A, areas designated by numeral 14 are the auxiliary areas. As shown in the exemplary illustration of FIG. 2A, auxiliary areas 14 may comprise wide stripes 14A substantially parallel to the edges of the substrate. In most cases, the wide stripes may provide efficient current conductivity since the entire surface of substrate 10 is coated with an electrically conductive material prior to the selective deposition of the plate resist. Optionally, if needed for further current connectivity, auxiliary areas 14 may further comprise narrower stripes connecting antenna-areas 12 to the wide stripes.

The term "complementary areas" refers to the remaining areas on the surface of the substrate onto which an electric insulating material (plate resist) is applied during the manufacturing process. With reference to FIG. 2A, areas designated by numeral 16 are the complementary areas. The pattern of the RFID array, namely the shape of the antennas and the distance between them, is pre-designed according to the desired pitch of the RFID labels and their specific use. The pre-designed pattern of the complementary areas is designed such that areas associated with the antennas and the connecting stripes remain uncoated during the selective application of the electrically insulating material on substrate 10.

Although a specific exemplary pattern of auxiliary areas to enable the process of electroplating is described, it should be understood to a person skilled to the art that the embodiments of the present invention are not limited in this respect and the auxiliary areas may be at any shape or size suitable for the electroplating process. Although twenty seven antennas arranged in three rows are shown in FIGS. 2A-2C, it should be understood to a person skilled in the art that the scope of the present invention is not limited in this respect and any other RFID antenna array may be manufactured using the method according to embodiments of the present invention.

The term "electrically insulating material" as used herein refers to materials having the capability to prevent formation of a metallic layer during the electro-deposition process on areas of the substrate covered by this material. An electrically insulating material, as defined herein is resistant to electrolyte solutions used for electroplating, such as, sulfuric acid. Additionally, the electrically insulating material, as defined herein is removable from an electrically conductive layer, such as copper layer, without affecting the electrically conductive layer. According to embodiments of the invention, the method includes stripping off the electrically insulating material from the electrically conductive material using basic solutions, such as NaOH.

The process of selectively coating substrate 10 may be performed in various methods, such as, gravure printing, screen printing, inkjet printing and other applicable methods which may be used in a vacuum or an atmospheric environment.

Alternatively, according to other embodiments of the present invention, the method may include performing UV lithography to selectively apply on the complementary areas the electrically insulating material. The lithography may include applying photoresist layer to the electrically conductive layer by any technique known in the art, such as, lamination or wet coating. Then, lithography may include applying a pre-designed mask onto the photoresist and illuminating the photoresist through a pre-designed mask with an electromagnetic radiation, such as an ultraviolet radiation. The illumination may cure the photo resist not covered by the mask on the complementary areas and the un-cured material, which was not exposed to the radiation, may be removed. Alternatively, an ultraviolet laser plotter may be used to cure the material on selective pre-designed areas.

According to embodiments of the present invention, the method may include electroplating the patterned substrate to a desired thickness according to the desired thickness of the antennas (box 140 of FIG. 1). The antenna areas 12 coated with a thin layer of electrically conductive material may serve as a seeding layer for the electroplating process. The seeding layer may be electroplated with using the same material of the seeding layer by a standard electro-deposition process. Alternatively, the seeding layer may be electroplated by second material different than material of the seeding layer. The electro-deposition may increase the thickness of the patterned metal layer to the desired thickness with minor effects on the required shape of the antennas. Electroplating is often also called electro-deposition, and the two terms are used interchangeably.

The electroplating may be processed as a roll to roll electroplating line. The first processing stage is electrodeposition. Electrodeposition is the process of producing a metallic coating on a surface by the action of electric current. In the electro-deposition process, according to some embodiments of the present invention, the film is unwound and is immersed into an electrolyte solution, such as sulphuric acid ($H_2SO_4$). The base layer 18 on substrate 10 is connected to an electrical circuit as the cathode and a metallic anode may release metal ions to the solution. Alternatively, the metal ions, such as, copper ions may reach the solution from dissolving electrolytes (metal salts or oxides) into the solution.

When an electrical current is passed through the circuit, the metal ions in the solution, such as copper ions ($Cu^{++}$), are attracted to areas 18 having a top of an electrically conductive material. Accordingly, the ions are deposited on this layer in an evenly manner and form a second metal layer 20 on areas corresponding to antenna-areas 12. Although for the purpose of the present example, copper is used as the coating metal, it should be understood to a person skilled in the art that the scope of the present invention is not limited in this respect and other metals such as aluminum, nickel, silver, chromium and others may be used. It should be understood that metal alloy or combination of metal ions may be used as well. It should be understood to a person skilled in the art that the first and second metal layers may contain the same metal and may blend to form a single active layer. Alternatively, first metal and second metal layer may comprise different metals or alloys and accordingly may be distinguishable.

Next, the method may include removing the electrically insulating material using any method known in the art (box 150). In the next bath of the line, the method may include chemically etching a thin layer of the electrically conductive layer from the entire surface, to entirely remove the electrically conductive material from the complementary areas such that in the complementary areas, substrate 10 is exposed (box 160).

Figure 3:
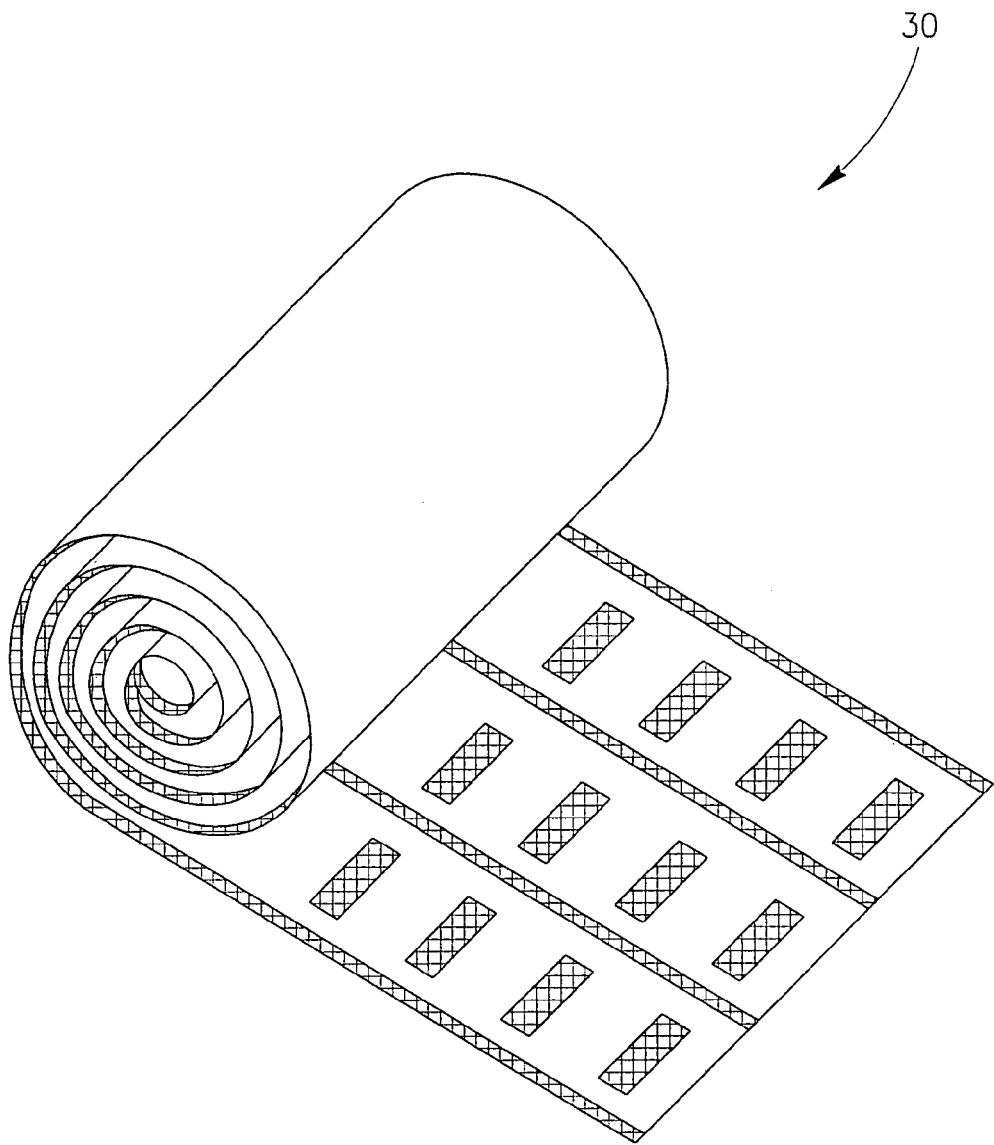
FIG. 3 is an illustration of an exemplary roll of RFID antennas manufactured according to embodiments of the present invention.

According to embodiments of the invention, the method includes controlling the electroplating process to generate an electroplated pattern with any desired thickness, without affecting the exact shape of the antennas. An illustration of an exemplary pattern of RFID antennas on a roll of substrate 30 manufactured according to embodiments of the present invention is shown in FIG. 3. The roll of substrate having the array of antennas thereon may then be further processed to the final product, namely, RFID labels and tags.

Figure 4A:
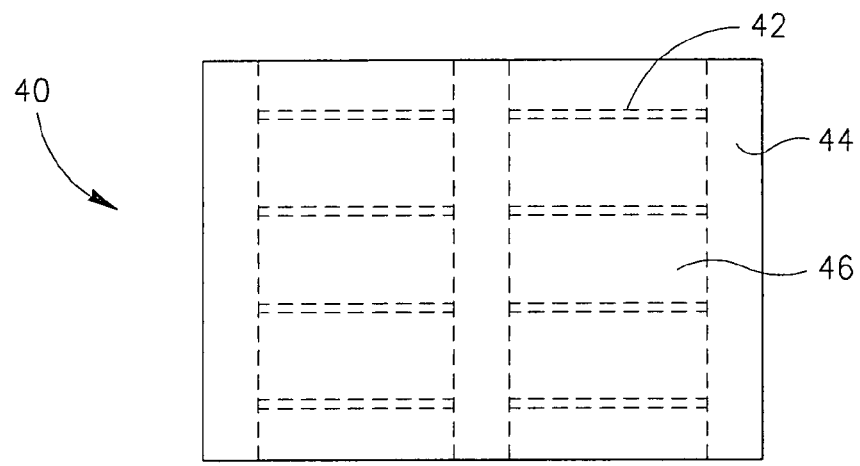
FIGS. 4A-4C are pictorial illustrations showing the manufacturing process of an exemplary TCE grid according to embodiments of the present invention.
Figure 4B:
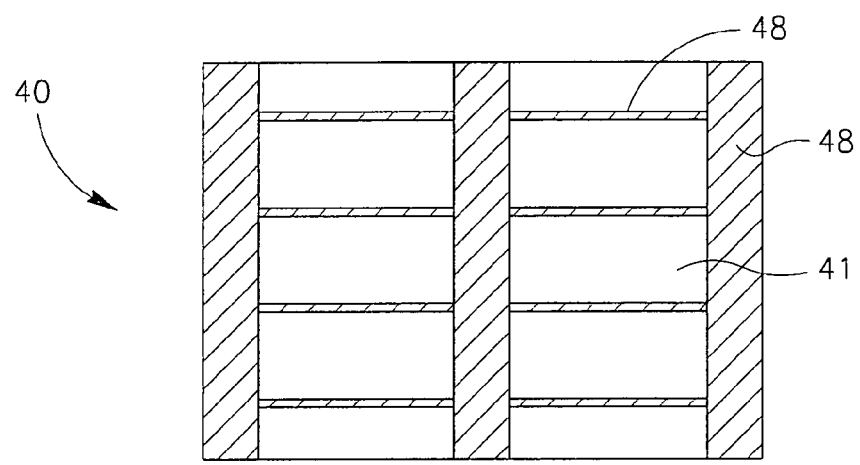
Figure 4C:
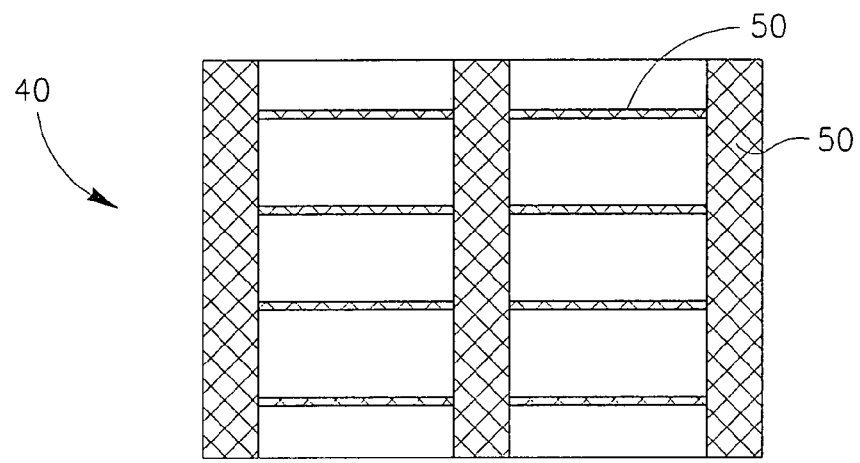

As discussed above, another exemplary application of the manufacturing method of a pattern of conductive objects according to embodiments of the present invention may be a process for manufacturing electrically conductive grids suitable as transparent conductive electrodes (TCE). FIGS. 4A-4C show illustrations of exemplary rolls of TCE grids manufactured according to embodiments of the present invention. Referring back to FIG. 1, the method may include providing a substrate 40 suitable for TCE (box 110 of FIG. 1). Substrate 40 may be continuously wound in a form of a roll. Alternatively, sheets of substrate material may be used in the manufacturing process. The substrate may be a polymeric substrate such as, for example, a polyester (PET) film, a polypropylene (PP) film, a polyethylene (PE) film, polyimide (PI) film, Ultem film, polyethylenenaphtalate (PEN) film, polycarbonate (PC) substrate and PVC substrate.

Then, the method may include depositing an electrically conductive layer onto substrate 40 (box 120 of FIG. 1). The thickness of the deposition layer is typically 0.1 micron, although it may vary between 1 nanometer and 2 micron. According to some embodiments of the present invention, the method may include performing an in-vacuum metallization process by resistive vapor vacuum metallization as detailed above.

Optionally, according to embodiments of the present invention, prior to depositing the electrically conductive layer, the method may include applying onto the substrate a layer that includes conducive polymers, conductive transparent inorganic compounds or any combination thereof. This process may be performed by sputtering or any other atmospheric coating process. Non-limiting examples of conducive polymers includes Polyaniline (PANI), Polyethylenedithiophene (PEDT) and Polyethylenedioxidethiophene (PE- DOT) Non-limiting examples of conductive transparent inorganic compounds includes Indium Tin Oxide (ITO), Zinc oxide, Aluminum doped zinc oxide (AZO), Zinc doped Indium Oxide (IZO), Indium oxide and Flourinated tin oxide (FSO).

Next, the method may include selectively depositing an electrically insulating material 41 onto the electrically conductive layer (box 130 of FIG. 1) according to a pre-determined pattern. Accordingly, as illustrated at FIG. 4B, the top surface of substrate 40 after this stage may include two defined areas, namely, areas 41 having the electrically insulating surfaces referred to as "complementary areas" and areas 48 having the electrically conductive surface, namely the grid lines and the connecting stripes.

Optionally, this process may be held in the vacuum chamber following in-line the previous vacuum deposition operation. With reference to the exemplary illustration of FIG. 4A, areas designated by numeral 42, namely, areas on the surface of substrate 40 on which electrically conductive grid lines are placed in the manufacturing process are the "object-areas" as defined above. Similarly, areas designated by numeral 44, namely, areas on the surface of substrate 40 on which wide stripes to enhance current connectivity placed in the manufacturing process are the "auxiliary areas" as defined above.

With reference to FIG. 4A, areas designated by numeral 46 are the complementary areas. The pattern of the conductive grid is pre-designed according to the desired application and its specific use. The pre-designed pattern of the complementary areas is designed such that areas associated with the grid lines and auxiliary areas remain uncoated during the selective application of the electrically insulating material on substrate 40.

According to embodiments of the present invention, the method may include electroplating the patterned substrate with a second electrically conductive layer 50 (see FIG. 4C) having a desired thickness according to the desired thickness of the grid (box 140 of FIG. 1). The object-areas 48, which are coated with a thin layer of electrically conductive material, may serve as a seeding layer for the electroplating process. The seeding layer may be electroplated using the same material of the seeding layer by a standard electro-deposition process. Alternatively, the seeding layer may be electroplated by second material different than material of the seeding layer. The electro-deposition may increase the thickness of the patterned metal layer to the desired thickness with minor effects on the required shape of the grid. Electroplating is often also called electro-deposition, and the two terms are used interchangeably.

Next, the method may include removing the electrically insulating material using any method known in the art (box 150). In the next bath of the line, the method may include chemically etching a thin layer of the electrically conductive layer from the entire surface, to entirely remove the electrically conductive material from the complementary areas such that in the complementary areas, substrate 40 is exposed (box 160). According to embodiments of the present invention, the etching stage may be the final stage of manufacture of the electrically conductive grid.

Optionally, according to embodiments of the invention, the method includes further processing of the patterned electrically conductive substrate. For example the method may include a further process of plating the grid, in line or offline, adding a third layer on the second layer (the electroplated layer). The post-plating process may involve plating only the grid lines. The electrically conductive material used for the second electroplating process may be any electro-plateable material such as silver, gold, palladium, titanium, chromium, zinc, tin and platinum. It should be understood that metal alloy or combination of metal ions may be used as well. It should be understood to a person skilled in the art that the first and second metal layers may contain the same metal and may blend to form a single active layer. Alternatively, first metal and second metal layer may comprise different metals or alloys and accordingly may be distinguishable. Additional electroplated layer may be added with materials different of similar to the previous layers. According to some embodiments of the present invention, the additional electroplating processes may be performed prior to the etching stage.

For example, optionally, the method may include a further process of an additional chemical reaction with an added material or materials with the top surface of the grid lines to create specific required characteristics. A non-limiting example for such a chemical reaction involves passivation of the top layer by an oxidation reaction. The chemical reaction may produce a metal-oxide layer on a top surface of the second electrically conductive layer.

Figure 5A:
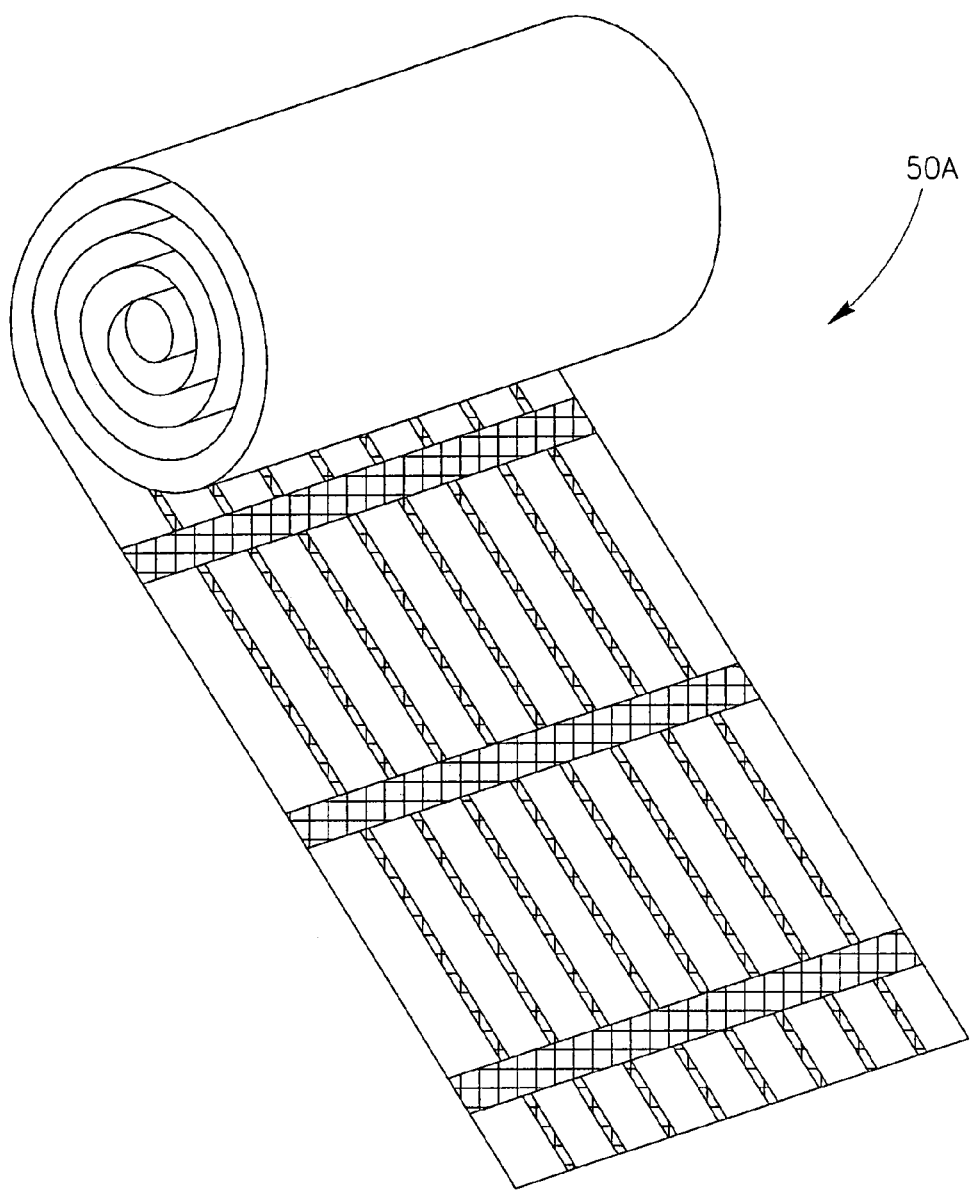
FIGS. 5A-5C are illustrations of exemplary rolls of TCE grids manufactured according to embodiments of the present invention.
Figure 5B:
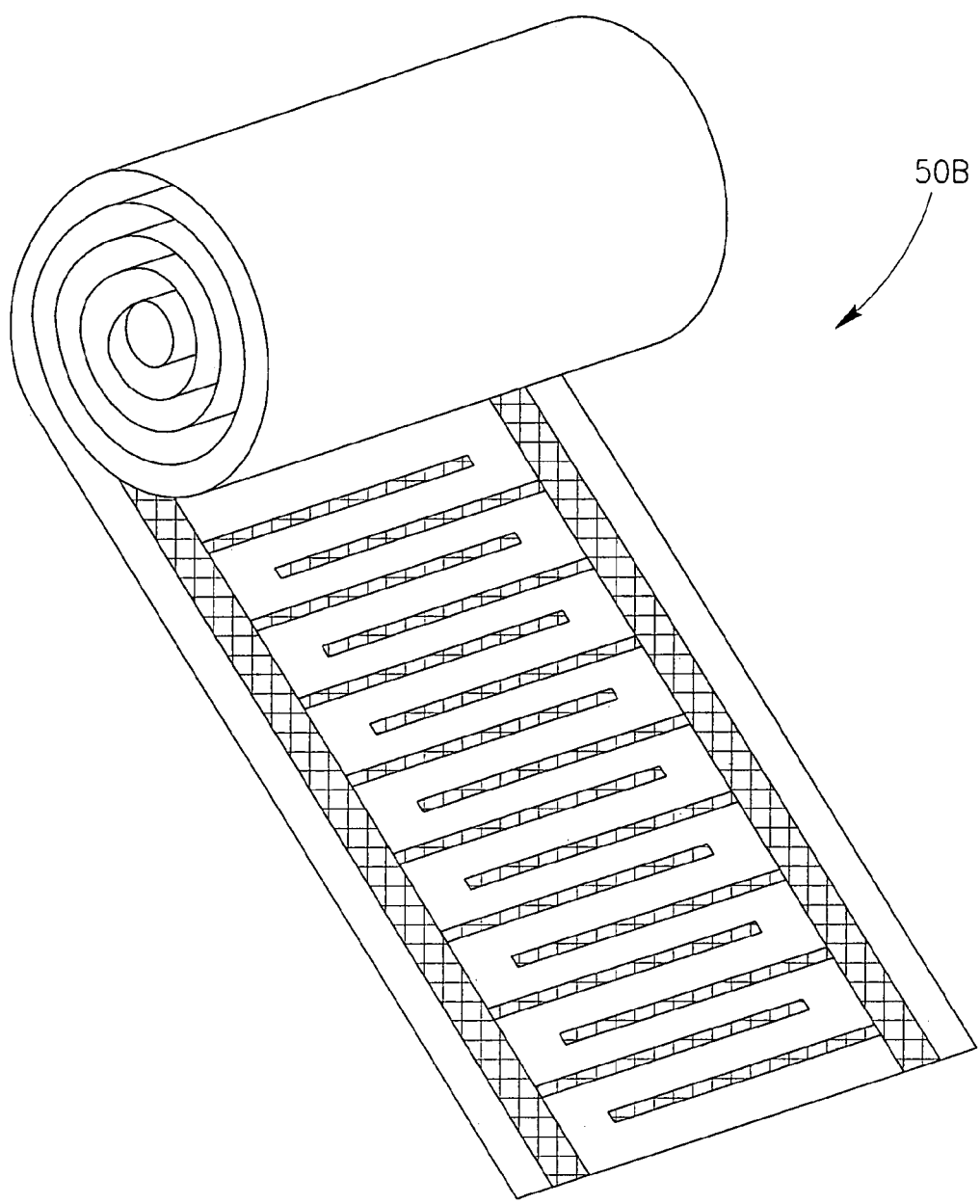
Figure 5C:
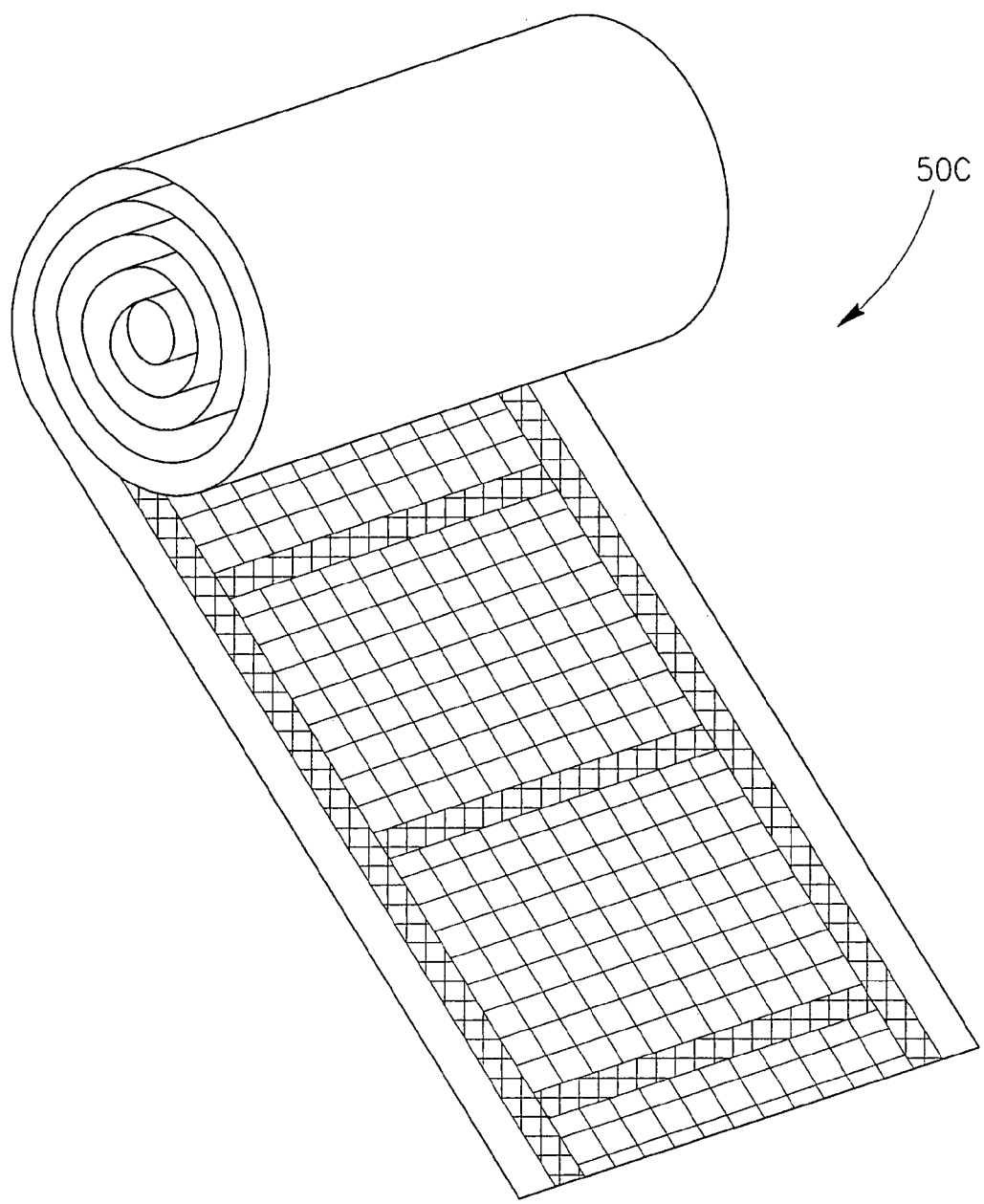

According to other embodiments of the invention, another post plating process may involve printing or otherwise applying an insulating material on a top surface of the grid lines. According to other embodiments of the present invention, another post plating process may involve applying onto the substrate a layer that includes conductive polymers. Yet, another post plating process may involve applying electrically conductive transparent inorganic compounds, such as, ITO onto the substrate. This process may be performed by sputtering. It should be understood to a person skilled in the art that the Illustrations of three exemplary patterns of conductive grids laid out on rolls of substrate 50A-50C, respectively, manufactured according to embodiments of the present invention are shown in FIGS. 5A-5C.

Figure 6:
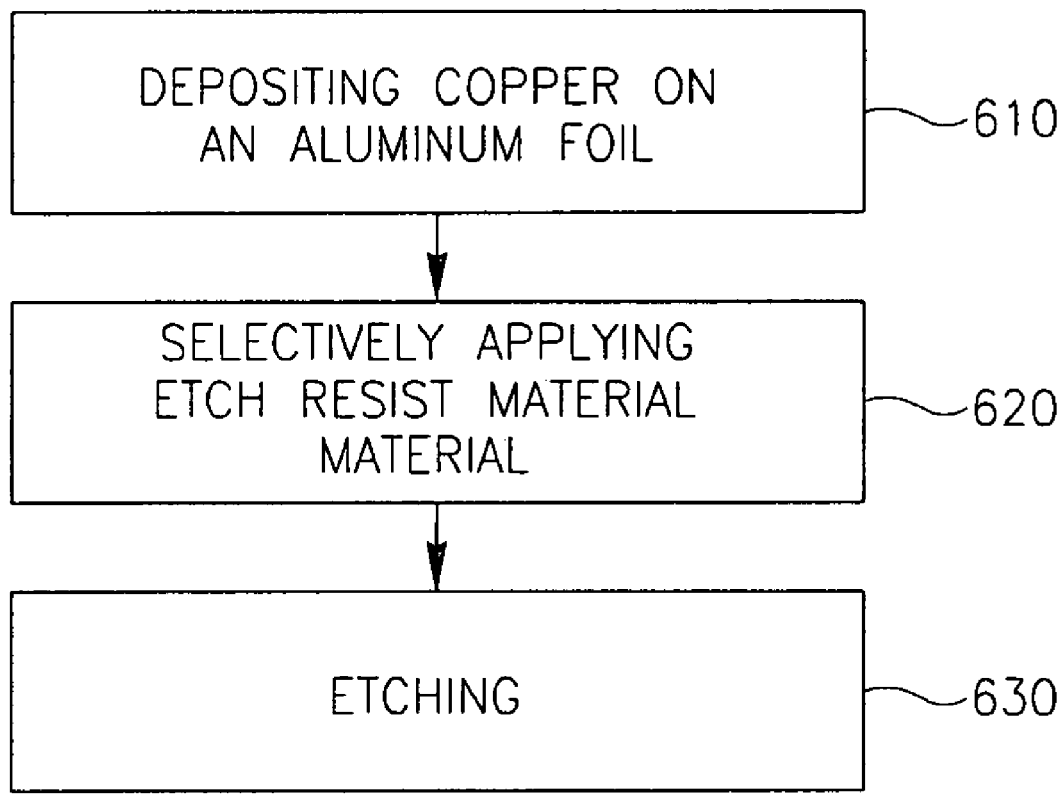
FIG. 6 is a flowchart illustration of a method for manufacturing a pattern of conductive objects according to some embodiments of the present invention.

Reference is now made to FIG. 6, which is a flowchart diagram demonstrating a method for manufacturing an array of RFID antennas according to embodiments of the present invention. According to some embodiments of the present invention, an Aluminum foil laminated to a substrate, such as polymeric substrate is provided. The aluminum foil is then coated with a layer of electrically conductive material, such as copper (box 610).

According to some embodiments of the present invention, the coating of the aluminum foil with the electrically conductive material may be performed in a vacuum chamber. The in-vacuum metallization process is performed by resistive vapor vacuum metallization. Alternatively, according to other embodiments of the present invention, the in-vacuum metallization process may be performed by inductive vacuum metallization sputtering, electron beam gun or any other applicable physical vacuum deposition technique as known in the art.

The metallic substance used for these processes may be copper, aluminum, nickel, silver, stainless steel and others, various metallic alloys, for example, bronze and brass or any combination of co-deposited metals. Other non-metallic electrically conductive materials may be used. Non-limiting examples of such materials may be indium-oxide and indium-tin oxide. In the exemplary embodiments described below, the electrically conductive material is copper. Although, in the description below, in the exemplary embodiments of methods of producing an array of RFID antennas copper is described for clarity and simplification, it should be understood to a person skilled in the art that embodiments of the present invention may use other depositions.

Optionally, the vacuum deposition may be followed by an electrodeposition as described above to increase the thickness of the metallic layer.

Alternatively, according to other embodiments of the present invention, the coating of the aluminum foil with the electrically conductive material may be performed solely by the electro-deposition process.

Next, an etch resist material may be selectively deposited onto the copper layer according to a pre-designed pattern (box 620). Optionally, this process may take place in the vacuum chamber following in-line the previous vacuum deposition operation. The pre-designed pattern has the shape of the array of RFID antennas. The etch resist material may be resistant to basic solutions and may be stripped by organic solvents. A non-limiting example of suitable etch-resist materials may be XZ55 etch resist manufactured by Coats Electrographic Company.

Next, for the etching process the substrate may be immersed in a suitable basic solution capable of etching both aluminum and copper (box 630). Non-limiting examples for such a solution may be aqueous mixture of $NH_4OH$ and $H_2O_2$. The etching process removes the copper and the aluminum from areas that are complementary to the antenna-areas and reveals the substrate. Next, the etch resist material may be stripped off using for example an organic solvent.

The final product may be an array of RFID antennas made of etched aluminum with a top surface of copper. The roll of substrate having the array of antennas thereon may then be further processed to produce RFID labels and tags.

According to other Embodiments of the present invention, an Aluminum foil laminated to a substrate, such as polymeric substrate is provided. The aluminum foil is then coated with a layer of etch resist material according to a pre-designed pattern corresponding to the shape of an array of RFID antennas. The aluminum foil is then etched and the etch resist material is stripped off. The intermediate product is an array of etched aluminum having the shape of a desired array of RFID antennas.

Then the substrate is immersed in an electrolyte solution and electrodeposited with copper. Similarly, the final product may be an array of RFID antennas made of etched aluminum with a top surface of copper.

It is appreciated that one or more of the steps of any of the methods described herein may be omitted or carried out in a different order than that shown, without departing from the true spirit and scope of the invention.

While the present invention has been described with reference to one or more specific embodiments, and mainly to embodiments describing the manufacturing of an array of RFID antennas, the description is intended to be illustrative of the invention as a whole, and is not to be construed as limiting the invention to the embodiments shown. As explained above, it should be understood to a person skilled in the art that embodiments of the present invention may be used for the manufacturing of conductive objects related to flexible electronics, such as, for example, membranes, switches, flexible printed circuit boards, conductive panels and the like.

It is appreciated that various modifications may occur to those skilled in the art that, while not specifically shown herein, are nevertheless within the true spirit and scope of the invention.

What is claimed is:

1. A method for manufacturing a pattern of conductive objects, the method comprising:
    depositing in a vacuum deposition chamber an electrically conductive material onto a substrate to form a base layer;
    applying an electric insulating agent on selective areas of the base layer, wherein the selective areas are substantially complementary to areas pre-designed to carry the conductive objects;
    electroplating the areas pre-designed to carry the conductive objects with a second electrically conductive layer;
    removing the electric insulating agent;
    chemically etching so as to remove the base layer from the selective areas and a top layer of the of the second electrically conductive layer to create the pattern of conductive objects on the substrate; and
        after the etching, performing an oxidation reaction to produce a metal-oxide layer on a top surface of the electrically conductive layer,
    wherein the pattern of conductive objects being an array of transparent electrodes, heaters or electromagnetic interference shields.

2. A The method for manufacturing a pattern of conductive objects, the method comprising:
    applying a coating layer onto a substrate, wherein the coating layer comprises electrically conductive transparent inorganic compounds;
    depositing in a vacuum deposition chamber an electrically conductive material onto the coating layer to form a base layer;
    applying an electric insulating agent on selective areas of the base layer, wherein the selective areas are substantially complementary to areas pre-designed to carry the conductive objects;
    electroplating the areas pre-designed to carry the conductive objects with a second electrically conductive layer;
    removing the electric insulating agent; and
    chemically etching so as to remove the base layer from the selective areas and a top layer of the of the second electrically conductive layer to create the pattern of conductive objects on the coating layer.

3. The method of claim 2, wherein the pattern of conductive objects being an array of transparent electrodes, heaters or electromagnetic interference shields.

4. The method of claim 2 comprising:
    after the etching, applying an insulating coating layer onto the second electrically conductive layer.

5. A method for manufacturing a pattern of conductive objects, the method comprising:
    depositing in a vacuum deposition chamber an electrically conductive material onto a substrate to form a base layer;
    applying an electric insulating agent on selective areas of the base layer, wherein the selective areas are substantially complementary to areas pre-designed to carry the conductive objects;
    electroplating the areas pre-designed to carry the conductive objects with a second electrically conductive layer;
    removing the electric insulating agent;
    chemically etching so as to remove the base layer from the selective areas and a top layer of the of the second electrically conductive layer to create the pattern of conductive objects on the substrate; and
    applying a coating layer onto the substrate after the etching, wherein the coating layer comprises one or more electrically conductive transparent inorganic compounds,
    wherein the pattern of conductive objects being an array of transparent electrodes, heaters or electromacinetic interference shields.

6. The method of claim 5 comprising:
    applying a priming layer onto the substrate prior to depositing the electrically conductive material.

7. The method of claim 5 comprising:

applying another coating layer after the etching that comprises one or more conductive polymers.

8. The method of claim 7, wherein the conductive polymers includes, Polyaniline (PANI), Polyethylenedithiophene (PEDT), Polyethylenedioxidethiophene (PEDOT) or any combination thereof.

9. The method of claim 5, wherein the electrically conductive transparent inorganic compounds includes indium tin oxide, zinc oxide, aluminum doped zinc oxide, zinc doped indium oxide, indium oxide, flourinated tin oxide and any combination thereof.

10. The method of claim 5 comprising:

electroplating the second electrically conductive with a third electrically conductive layer.

11. The method of claim 5 comprising:

after the etching, applying an insulating coating layer onto the second electrically conductive layer.

12. The method of claim 5, wherein depositing the electrically conductive material comprises using resistive vacuum metallization, inductive vacuum metallization sputtering or electron beam gun deposition.

13. The method of claim 5, wherein depositing the electrically conductive material comprises depositing copper, aluminum, nickel, silver, stainless steel, indium oxide, indium-tin oxide, metallic alloy deposition or co-deposition of metals or metallic alloys.

14. The method of claim 5, wherein electroplating comprises depositing copper, tin, nickel, silver, chromium, brass, bronze or a combination thereof.

* * * * *